United States Patent [19]

McAdams

[11] 4,327,426
[45] Apr. 27, 1982

[54] COLUMN DECODER DISCHARGE FOR SEMICONDUCTOR MEMORY

[75] Inventor: Hugh P. McAdams, Houston, Tex.

[73] Assignee: Texas Instruments, Incorporated, Dallas, Tex.

[21] Appl. No.: 120,595

[22] Filed: Feb. 11, 1980

[51] Int. Cl.³ .............................................. G11C 7/02
[52] U.S. Cl. .................................................. 365/203
[58] Field of Search ....................... 365/149, 203, 205

[56] References Cited

U.S. PATENT DOCUMENTS

| | | | |
|---|---|---|---|
| 4,063,118 | 12/1977 | Nishimura | 365/203 |
| 4,074,148 | 2/1978 | Sato | 365/205 |
| 4,144,590 | 3/1979 | Kitagawa et al. | 365/203 |
| 4,200,917 | 4/1980 | Moench | 365/203 |

Primary Examiner—Stuart N. Hecker
Attorney, Agent, or Firm—John G. Graham

[57] ABSTRACT

A random access read/write MOS memory device employs an array of rows and columns of memory cells which are accessed by an address input applied to row and column decoders. To avoid unwanted trapping of voltages on unselected column decoder outputs, the circuitry of the invention provides positive discharge of nodes which should not maintain voltage thereon.

9 Claims, 7 Drawing Figures

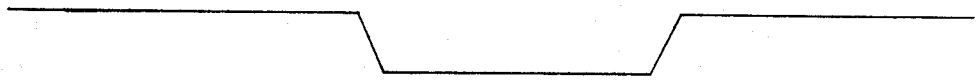
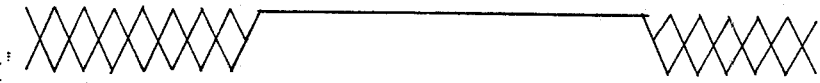
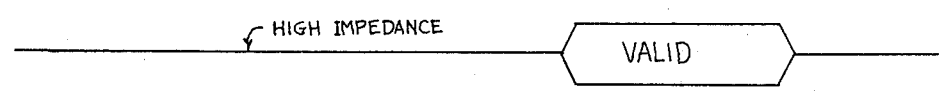
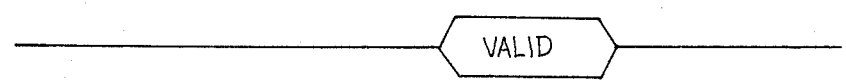
Fig. 2

COLUMN DECODER DISCHARGE FOR SEMICONDUCTOR MEMORY

BACKGROUND OF THE INVENTION

This invention relates to semiconductor memory devices and more particularly to a dynamic memory device of the type having an array of rows and columns of memory cells.

The most widely used semiconductor memory devices at present are large scale arrays of one-transistor dynamic memory cells of the type described in U.S. Pat. No. 3,940,747, issued Feb. 24, 1976, to Kuo and Kitagawa, assigned to Texas Instruments. Higher density versions of these memory systems are shown in Electronics, May 13, 1976, pp. 81–86. These high density devices use one-transistor dynamic memory cells which have the advantage of very small size, and thus low cost. Row addresses and column addresses are separately applied to row and column decoders which select on row and one column for access, with the remaining rows and columns being non-activated. In some situations, it has been found that the non-selected column decoder outputs can have unwanted voltages trapped thereon, as there is no path for discharge. This condition can result in loss of data or storing of erroneous data.

It is the object of this invention to provide an improved semiconductor memory device of the type having an array of rows and columns of dynamic memory cells, and in particular with provision for avoiding trapping of unwanted voltages on nodes in the decode circuitry.

SUMMARY OF THE INVENTION

In accordance with one embodiment of the invention, a random access read/write MOS memory device employs an array of rows and columns of memory cells which are accessed by an address input applied to row and column decoders. To avoid unwanted trapping of voltages on unselected column decoder outputs, the circuitry of the invention provides positive discharge of nodes which should not maintain voltage thereon.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows:

FIGS. 2a–2g are graphic representations of voltage vs time or other conditions vs time existing for various parts of the device of FIG. 1;

DETAILED DESCRIPTION OF SPECIFIC EMBODIMENT

The Memory System

Figure 1:
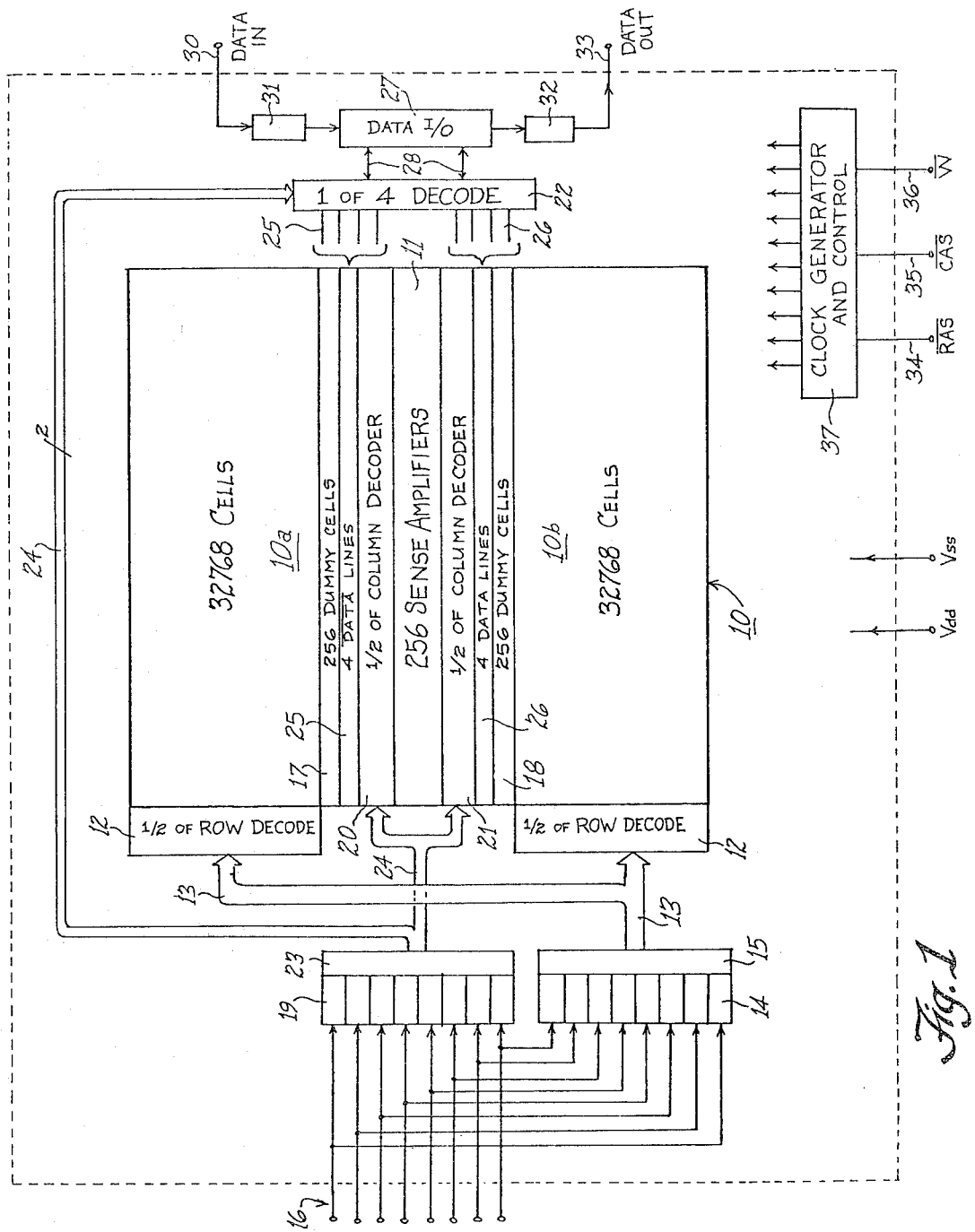
FIG. 1 is an electrical diagram in block form of a semiconductor dynamic memory device which may use the negative undershoot protection circuits of the invention as its inputs.

Referring to FIG. 1, a memory device which may utilize features of the invention in its input circuits is illustrated in block diagram form. This is a random access, read/write memory of the dynamic type, made by an N-channel, self-aligned, silicon gate, double-level-polysilicon, MOS process. All of the memory device of FIG. 1 is included in one silicon chip of about 1/30 of a square inch in size which usually would be mounted in a standard dual-in-line package having sixteen pins or terminals. The device includes in this example an array 10 of 65,536 memory cells, with the array split into two halves 10a and 10b of 32,768 cells each, in a regular pattern of 256 rows and 256 columns. Of the 256 row or X lines, there are 128 in the array half 10a and 128 in the half 10b. The 256 column or Y lines are each split in half with one half of each column line being in each of the halves 10a and 10b. There are 256 sense amplifiers 11 in the center of the array; these are differential type bistable circuits made according to the invention disclosed and claimed in U.S. Pat. No. 4,239,993 and assigned to Texas Instruments. Each sense amplifier is connected in the center of a column line, so 128 memory cells are connected to each side of each sense amplifier by a column line half. The chip requires only a single +5 V Vdd supply, along with a ground terminal Vss. No internal charge pump is needed because no substrate bias is employed.

A row or X address decoder 12, split into two halves, is connected by sixteen A and $\bar{A}$ lines 13 to eight address buffers or latches 14 via output circuits 15. The buffers 14 have inputs which use the features of the invention as described in detail below. An eight-bit X address at TTL voltage levels is applied to inputs of the address buffers 14 by eight address input terminals 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of dummy cells 18 is activated. The address signals on the input lines 16 are multiplexed; the Y address is also applied to these input lines and is latched into a set of eight buffers 19, also using the input circuits according to the invention, from which the address is applied to column decoders 20, 21 and 22 via output circuits 23 and lines 24. A one-of-64 selection is made by the column decoders 20 and 21, so that one group of four columns is connected to sets of four data and data bar lines 25 and 26, based on six bits of the eight bit Y address. A one-of-four decoder 22 selects one pair of the four pairs of lines 25 and 26, based on two bits of the eight bit Y address, and connects the selected pair to a data I/O control circuit 27 via a pair of lines 28. A single bit data input is applied by an input terminal 30 to a data input latch 31, and the output of this latch is coupled to the data I/O control 27. The latch 31 may use the input arrangement having features according to the invention and is of the same circuit design as the address buffer circuits 14 and 19. One-bit data output is connected from the data I/O control 27 through a buffer 32 to a data out terminal 33.

The X address must appear on the inputs 16 when a row address strobe signal, referred to as $\overline{RAS}$, is applied to an input 34. Likewise, the Y address must appear during a column address strobe signal $\overline{CAS}$ on an input 35. These inputs 34 and 35 may also use the circuits of the invention. A read/write control $\overline{W}$ on an input 36 is the other control signal for the device. These three inputs are applied through inputs according to the invention to clock generator and control circuitry 37 which generates a large number of clocks and control signals to define the operation of various parts of the device. When $\overline{RAS}$ goes low as seen in FIG. 2a, clocks derived from $\overline{RAS}$ cause the buffers 14 to accept and latch the eight TTL level bits then appearing on the input lines 16. When $\overline{CAS}$ goes low as seen in FIG. 2b then clocks generated in the circuitry 37 cause the buffers 19 to latch on the TTL level Y address signals on the inputs 16. The row and column addresses must be valid during the time periods shown in FIG. 2c. For a read cycle, the W signal on input 36 must be high during the period seen in FIG. 2d, and the output on the terminal 33 will be valid during the time seen in FIG. 2e. For a write-only cycle, the $\overline{W}$ signal must be low as seen in FIG. 2f and the data-in bit must be valid during the time seen in FIG. 2g. The data out pin stays in a high impedence state during a write-only cycle. A read/write cycle is also possible.

The Cell Array and Sense Amplifiers

Figure 3:
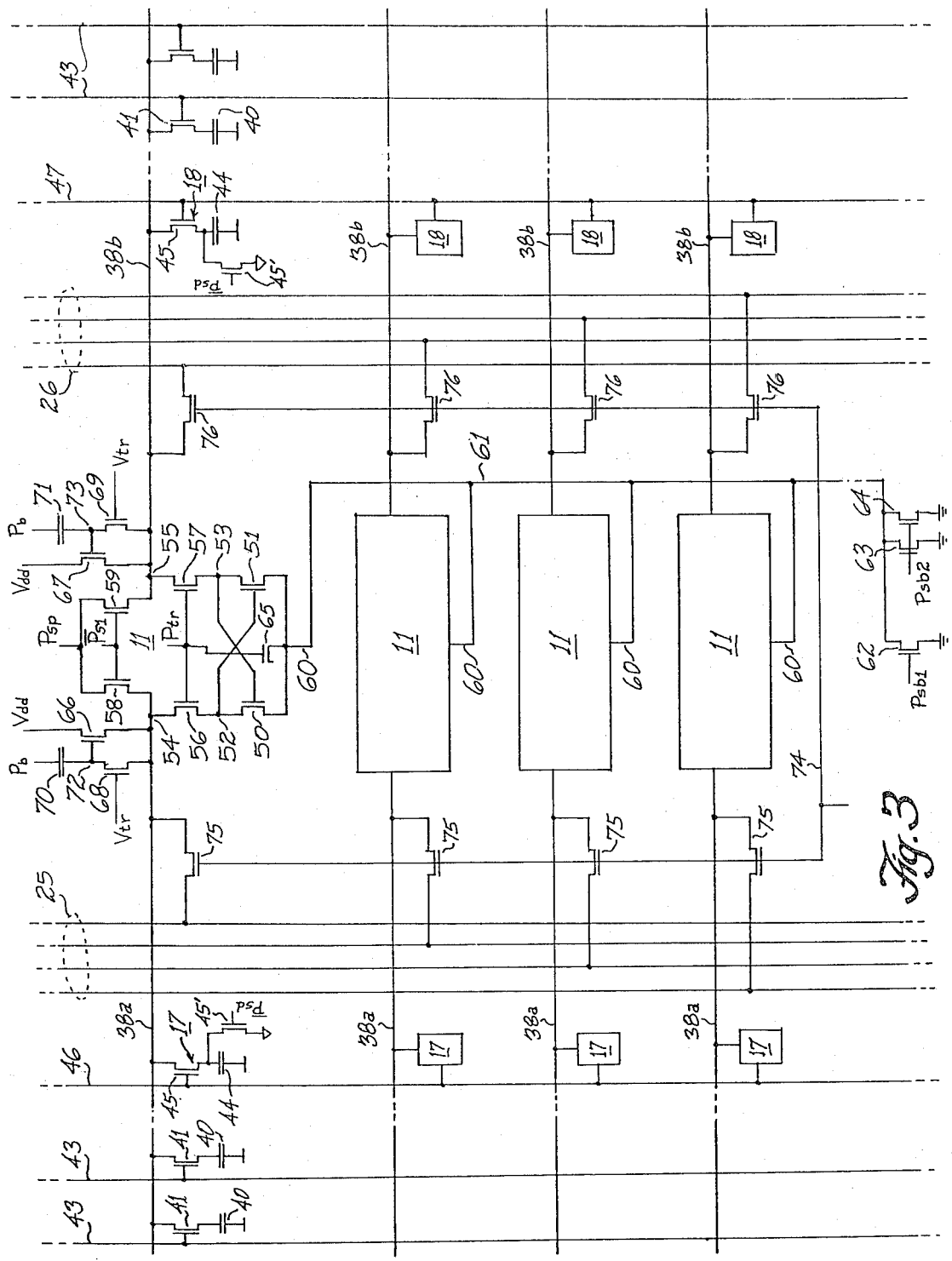
FIG. 3 is an electrical schematic diagram of the cell array in the device of FIG. 1.

In FIG. 3, a portion of the cell array is shown in schematic form. Four identical sense amplifiers 11 are positioned at the center of the array, connected to four column line halves 38a or 38b. Sixty-three other sets of four sense amplifiers and column lines are included in the array. Connected to each column line half 38a or 38b are 128 one-transistor cells each having a storage capacitor 40 and a transistor 41. The cells are of the type described in pending U.S. Patent application Ser. No. 648,594, filed Jan. 12, 1976 and Ser. No. 722,841, now U.S. Pat. No. 4,240,092, filed Sept. 13, 1976 by C-K Kuo, both assigned to Texas Instruments, or U.S. Pat. No. 4,012,757. Row lines 43 which are the outputs of the row decoders 12 are connected to the gates of all of the transistors 41 in each row; these are 256 identical row lines 43 in the array. Also connected to each column line half 38a or 38b is a dummy cell 17 or 18 which consists of a storage capacitor 44, an access transistor 45 and a grounding transistor 45'. The gates of all dummy cells in a row are connected to a line 46 or 47. When the X address selects one of the lines 43 on the left, the associated transistor 41 is turned on to connect the capacitor 40 for this selected cell to the column line half 38a, while at the same time the dummy cell select line 47 on the opposite site is activated, connecting the capacitor 44 in one of the cells 18 to the column line half 38b. The dummy cell capacitance 44 is about ⅓ that of the storage cell capacitance 40. The dummy cell is predischarged to a logic zero before every active cycle by 45'.

Figure 4:
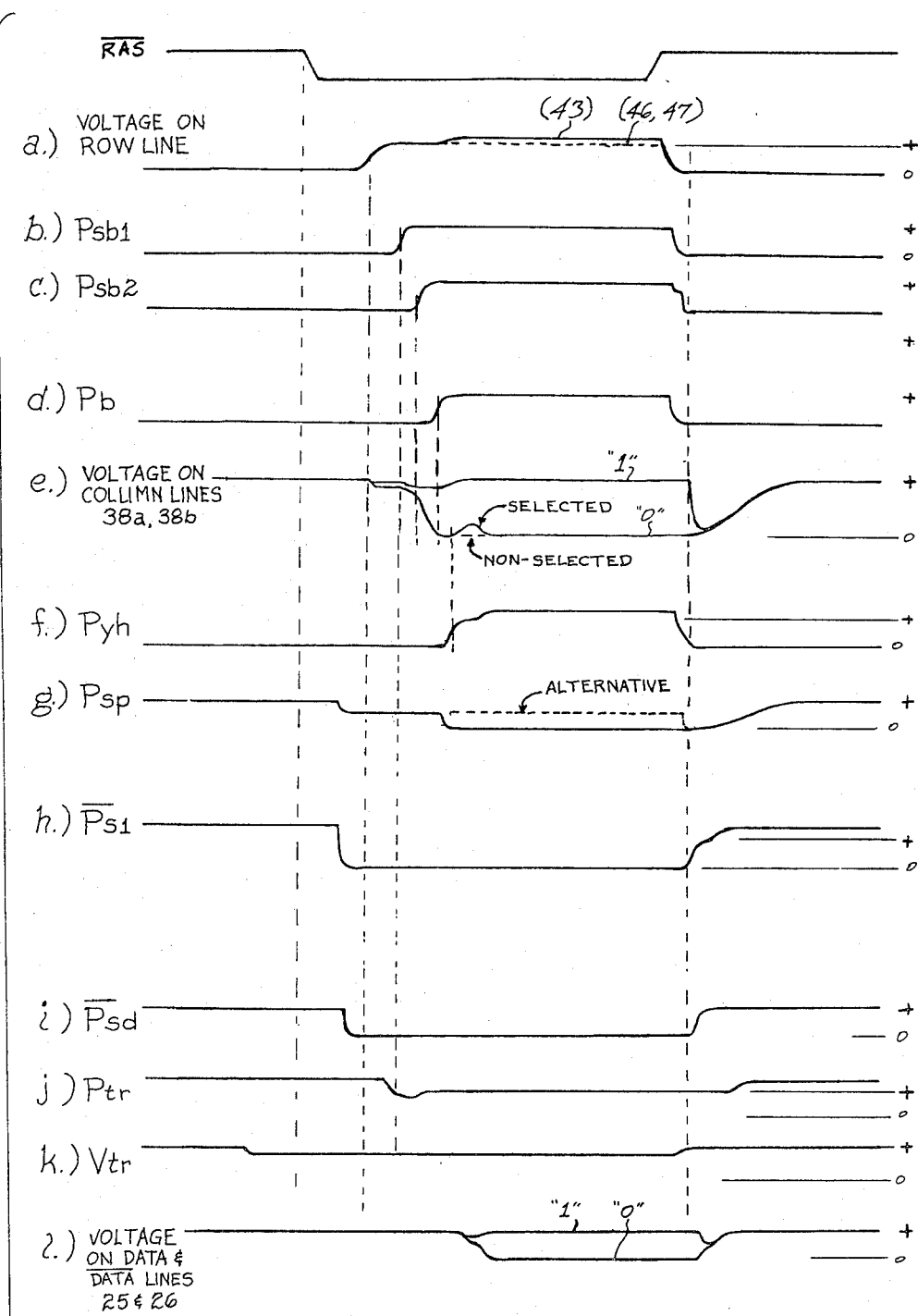
FIGS. 4a–4g are graphic representations of voltage vs time existing in various parts of the circuit of FIG. 3.

The sense amplifier consists of a bistable circuit having a pair of driver transistors 50 and 51, each with its gate connected to the drain 52 or 53 of the other to provide a cross-coupled flip-flop. The drains 52 and 53 are connected to nodes 54 and 55 at the ends of the lines 38a and 38b through the source-to-drain current paths of a pair of coupling transistors 56 and 57. The gates of the transistors 56 and 57 are both connected to a source of a clock voltage Ptr, seen in FIG. 4j. The nodes 54 and 55 and column line halves 38a and 38b are precharged through the source-to-drain current paths of a pair of transistors 58 and 59 connected to a voltage source Psp, shown in FIG. 4g. The gates of the transistors 58 and 59 are connected to a clock voltage Ps1 seen in FIG. 4h.

The sources of the driver transistors 50 and 51 are connected together at a node 60, and this node 60 is connected by a line 61 to the same node in all of the 256 sense amplifiers 11 in the array. The line 61 is connected to a transistor 62 and a dual channel transistor 63 and 64 which function as grounding paths. The gate of the transistor 62 is connected to a clock Psb1 seen in FIG. 4b, and the common gate of the dual transistors 63 and 64 is connected to a clock Psb2 seen in FIG. 4c. This grounding arrangement is similar to that of U.S. Pat. No. 4,144,590 or Electronics, May 13, 1976, p. 84, assigned to Texas Instruments. The two current paths of the dual transistor 63 and 64 turn on at different times because the channel area of the transistor 64 is ion implanted to raise its threshold voltage so that it turns on later than the transistor 63 even though the same clock is applied to its gate. The dual transistor 63 and 64 (actually one large transistor with different channel implants) is much larger than the transistor 62, in channel width to length ratio. Alternatively, the channel length of 64 would be longer than that of 63.

The column lines halves 38a and 38b along with nodes 54 and 55 are precharged to near Vdd during the precharge part of an operating cycle when both Psp and Ps1 are high. At this time Ptr is high so the nodes 52 and 53 are precharged also. The transistors 50 and 51 are off because the transistors 62–64 are all off, Psb1 and Psb2 being low. After $\overline{Ps1}$ has gone low, turning off the transistors 58 and 59, and before Psb1 goes high, an X address reaches one of the lines 43 at the same time that one of the dummy cell address lines 46 or 47 is activated. This causes an imbalance in the voltage on the nodes 54 and 55, and the same differential is coupled to the nodes 52 and 53 because the voltage Ptr is higher than Vdd. Then, when Psb1 goes high and the small transistor 62 turns on, the sensing operation is initiated and the nodes separate more as the bistable circuit including the transistors 50 and 51 goes toward a stable condition with one transistor conducting and the other cut off. A slight delay from Psb1, the clock Psb2 goes high to complete the sensing operation by latching the bistable circuit and obtaining a good one/zero set on opposing digit lines. By capacitor 65 along with the parasitic capacitances of the transistor 56 and 57, the voltage Ptr is dynamically level shifted from greater than Vdd down to Vdd; the drop in voltage on the node 60 toward Vss as Psb1 than Psb2 go high is coupled to the gates of the transistors 56 and 57.

An active pull-up circuit is employed in the sense amplifier to allow storage of a full Vdd level. This circuit comprises a pair of pull-up transistors 66 and 67 connecting the nodes 54 and 55 to Vdd, along with control transistors 68 and 69 connecting the gates of the transistors 66 and 67 to the nodes 54 and 55, and capacitors 70 and 71 connecting the gates to a boosting clock Pb occurring after Psb2. The gates of the transistors 68 and 69 are connected to a trap voltage Vtr which stays at a level of about 1 Vt below Vdd during the active part of the cycle then at Vdd during the precharge part.

After the sensing operation is essentially completed and Psb2 has come on to render first the low threshold transistor 63 then after a slight delay the higher threshold transistor 64 conductive, a definite logic one and logic zero are set up on the column lines 38a and 38b.

Then, about four ns after Psb2 goes high, the selected X line 43 (but not the dummy cell select line) is slowly boosted to a level of Vdd+Vt to permit restoration of a full Vdd level in the capacitor 40 for the selected cell. At the same time the X line 43 is being boosted, the clock Pb goes high to activate the active load circuits. The clock Pb causes level shift at either node 72 or 73 via the gated capacitors 70 and 71. Only one of these nodes will have retained a logic one because the column lines will be near the one/zero set at this time; conduction through the transistors 68 or 69 for the zero-going side will discharge node 72 or 73 and cause the gated capacitor 70 or 71 to exhibit very little capacitance so Pb will not charge the node 72 or 73 for this side. The other node 72 or 73 which retained a one, at near Vdd, will be shifted to greater than Vdd thereby allowing this column line half to be pulled back up to Vdd through transistor 66 or 67. At the same time as Pb occurs, the clock Psp is pulled to Vss.

Selection of one group of four of the 256 column lines 38a and 38b by a Pyh voltage occurs a slight delay from when Psb2 goes high. The one-of-64 column decoder 20 and 21, physically located in the space between the sense amplifiers 11 and the data and data bar lines 25 and 26, produces only one Pyh signal on a line 74 to activate only one set of four transistors 75 coupling nodes 54 to lines 25 and one set of four transistors 76 coupling nodes 55 to lines 26. The remaining sixty-three sets of sense amplifiers 11, although operative for refresh on every read or write cycle, will not be coupled to the data and data bar lines because the Pyh signal on the line 74 will be low for these.

COLUMN ADDRESS PRECHARGE CLOCKS

In the memory device of FIGS. 1 and 3, the capacitors 40 discharge with time and must be refreshed about every four milliseconds to maintain the data stored in the memory. Refresh is accomplished by applying a row address (FIG. 2c) and a $\overline{RAS}$ signal (FIG. 2a) but no column address or a $\overline{CAS}$ signal. The row addresses are incremented after each refresh cycle so every row is refreshed within a time period of 4 ms. In typical computer operations, long periods of time may transpire during which no $\overline{CAS}$ signal appears for a given memory chip because this chip will not be accessed for data, merely refresh. This presents a problem for precharge circuits used for column address or associated with the $\overline{CAS}$ signal. A $\overline{CAS}$ related precharge clock internal to the chip would drop from its intended amplitude of Vdd to a value of Vdd-Vt. Any nodes that are precharged normally to Vdd-Vt by means of source followers would drop an additional threshold voltage to Vdd-2 Vt. These drops in voltage could cause circuit malfunction once the CAS signal is activated after an extended period of refresh-only with just $\overline{RAS}$ ocurring. To prevent this mode of failure, a $\overline{RAS}$ related precharge clock is used to keep the $\overline{CAS}$ related precharge clock pumped up to its intended Vdd value over an indefinite period of time. The usual circuitry used to generate the $\overline{CAS}$ related precharge clock is not changed by the addition of the circuit of FIG. 5. This circuit makes use of the fact that $\overline{CAS}$ will be high (will not go low as in FIG. 2b) during long refresh periods, while RAS will go low as in FIG. 2a for refresh cycles.

Figure 5:
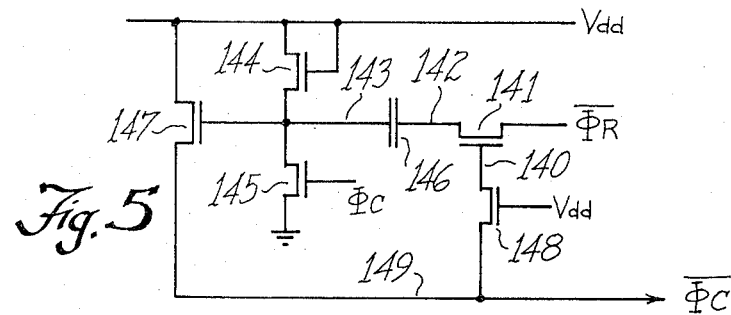
FIGS. 5 and 6 are electrical schematic diagrams of a part of the device of FIG. 1 showing circuits of the invention in detail, according to other embodiments.

In FIG. 5, $\overline{RAS}$-related clock $\overline{\Phi R}$ and $\overline{CAS}$-related clock $\Phi C$ are used. These are of approximately the same timing as $\overline{RAS}$ and $\overline{CAS}$ signals, for the purpose of this explanation, and are generated by the circuitry 37 for use in precharging various other cicuits within the chip. Under $\overline{RAS}$-only refresh operation, $\Phi C$ is high, at Vdd, when $\overline{\Phi R}$ is low during the RAS active state. Consequently, a node 140 will be high, Vdd−Vt, prior to $\overline{\Phi R}$ going high. So, when $\overline{\Phi R}$ goes high the node 140 will be booted above Vdd by the capacitance associated with the transistor 141, allowing the full Vdd level of $\overline{\Phi R}$ to be transferred to the node 142. Prior to the positive-going transition of $\overline{\Phi R}$, the node 142 is at the Vss potential of $\overline{\Phi R}$ while the node 143 has been charged to Vdd−Vt potential through a transistor 144. $\Phi C$ is at Vss when $\overline{\Phi C}$ is high so that the transistor 145 does not prevent the node 143 from charging up through the transistor 144. When $\Phi R$ makes its positive transition, the node 143 is booted above Vdd via the capacitor 146. By making the size of the capacitor 146 of sufficient magnitude relative to the size of transistor 147 and any parisitic capacitance associated with the node 143, the transistor 147 can be assured of being driven into triode operation, thus assuring that $\overline{\Phi C}$ is kept at Vdd potential by resupplying any charge that may have leaked off of $\overline{\Phi C}$. The transistor 141 is used to prevent the positive-going transition of $\overline{\Phi R}$ from causing any conduction in the transistor 147 if $\overline{\Phi C}$ is low during other modes of operation. If $\overline{\Phi C}$ is low when $\Phi R$ goes high, transistor 141 will be off and will not allow the node 142 to follow the $\overline{\Phi R}$ transition. The transistor 148 is used as a capacitive isolation device such that the gate of transistor 141 can be booted above Vdd and allow the full transition of $\Phi R$ to be coupled to the node 142. The transistor 145 discharges the node 143 when CAS is active, preventing any current path through the transistor 147 while $\Phi C$ is low (FIG. 2b). The transistor 144 is a long channel device of narrow width to keep down power consumption when $\Phi C$ is high. Charging of the node 143 though the transistor 144 need only occur some time before any substantial leakage has occurred on $\overline{\Phi C}$, which is consistent with a long channel, narrow width transistor 144. If the capacitor 146 is constructed as an MOS gated capacitor it is possible to delete the transistors 141 and 148 and the node 140 and connect $\Phi R$ directly to the node 142. Since $\Phi C$ is high when $\overline{\Phi C}$ is low, the node 143 is held low, preventing inversion from occurring in the capacitor 146, so with no inversion region the capacitor consists only of the physical overlap of the node 143 electrode and the N+ diffusion of the node 142. This overlap capacitance is very small compared to the inversion capacitance and the coupling to the node 143 from the positive transition of $\Phi R$ can easily be suppressed by the transistor 145.

An example of the use of the output signal $\overline{\Phi C}$ on the line 149 is in generation of clocks such as those employed for column address buffers 19 FIG. 1 for the $\overline{\Phi C}$ precharge of column decoders 20,21 of FIG. 1.

COLUMN ADDRESS DISCHARGE CIRCUIT

Figure 6:
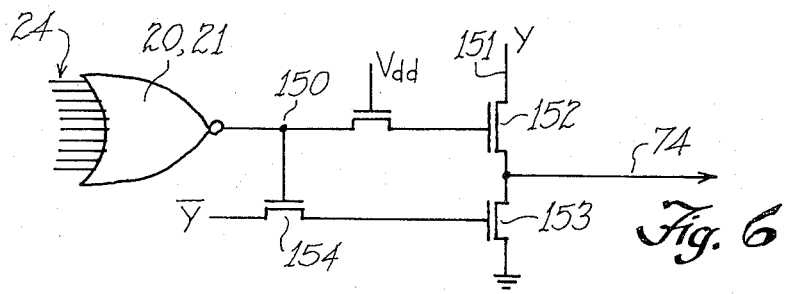
Figure 7:
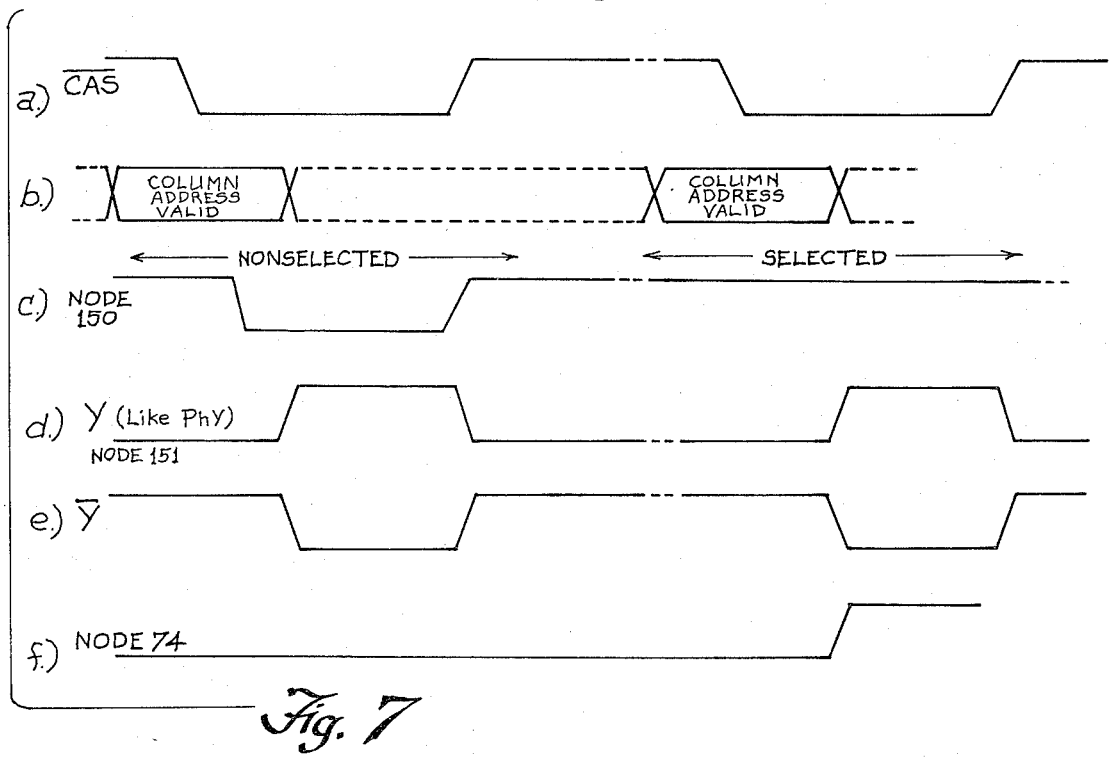
FIGS. 7a–7f are graphic representations of voltage vs time existing at various parts of the circuit of FIG. 6.

Refering to FIG. 6, a circuit is shown for generating column select voltages for applying to the lines 74 of FIG. 3. When the column address signals become valid on the lines 24, one or more of the twelve AY and $\overline{AY}$ address bits on the lines 24 will discharge the decoder output 150 for a non-selected decoder 20,21 as seen in FIG. 7c (left side). There are sixty-four of the decoders 20,21 and only one will remain with its output node 150 in its precharged condition, FIG. 7c (right side). Once all of the sixty-three non-selected decoders have settled, leaving only one decoder in its precharged condition, the Y signal of FIG. 7d, applied to the line 151 from control circuitry (not shown), goes high and this voltage is applied via transistor 152 to the selected line 74 to allow the data on addressed column lines 38a,38b of FIG. 3 to be gated out via transistors 75,76 to the I/O lines 25,26 and on to the I/O buffers. For the non-selected decoders 20,21 since the node 150 has been discharged the Y signal of FIG. 7d is not allowed to pass through the transistor 152 and so the line 74 remains at Vss. The potential on the line 74, however, is trapped on this node with very high impedance to any other node, so the additional circuitry of this improvement is needed.

If both of a pair of the lines 25,26 are pulled to Vss due to data from the selected sense amplifiers 11 or bit lines 38a,38b, one of the bit lines 25,26 goes to its high state due to data being written into the addressed cell, then coupling due to gate overlap capacitance occurs between an I/O line 25, 26 and a line 74, tending to push this line 74 toward a positive voltage above Vss. The magnitude of this voltage is a function of the overlap capacitance between the lines 25,26 and the line 74 via transistors 75,76, the parisitic capacitance associated with the line 74, and the magnitude of the voltage swing on the I/O line 25,26. Since the line 74 is of high impedance to Vss, this voltage remains capacitively stored on the line 74 and will only dissipate due to normal P-N junction leakage. If the magnitude of this coupled voltage on a line 74 is sufficient, it can cause gradual discharge of one of the column lines 38a,38b. If the active cycle is of sufficient length of time, this bit line can become discharged toward Vss, causing the selected storage cell to loose the high state which is to be written into it.

For a high speed dynamic RAM, the time interval between the node 150 going low as in FIG. 7c and the Y signal going high as in FIG. 7d is made as short as possible consistent with proper operations. If on some devices this time interval should be reduced due to processing variations, a small positive voltage could be trapped on a line 74 before discharge of the node 150 is completed. This small voltage is additive to that coupled to the line 74 as described above. This condition can cause poor yields and pattern sensitivities that show up only at certain timing or temperature conditions.

Accordingly, to correct these problems, the circuit of FIG. 6 employs a discharge transistor 153 connecting each of the sixty-four lines 74 to Vss with a $\overline{Y}$ signal as in FIG. 6 applied to its gate through a series transistor 154. The gate of the transistor 154 is connected to the node 150. For the unselected decoders 20,21, the discharge of the node 150 preceeds the discharge of $\overline{Y}$ to Vss. This causes a positive voltage well above Vt to be trapped on the gate of the transistor 153 since the transistor 154 is turned off before Y goes low. The transistor 153 is therefore on and presents a low impedance path to Vss for discharge of any voltage that may be on or be coupled onto the line 74. This prevents the gradual unintentional discharge of a column line and loss of data in a write operation. For the selected decoder 20,21, the node 150 remains in its precharged or high condition so that the transistor 154 is on when Y goes to Vss. Thus the gate of transistor 153 goes low with $\overline{Y}$ and the transistor 153 turns off, so the line 74 can follow Y as it would normally for a selected decoder.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A semiconductor memory device of the type having an array of rows and columns of dynamic memory cells, comprising: means for accessing the device by a row address along with a column address, said means including a row decoder and a column decoder, the column decoder having a plurality of output lines, clock voltage means for applying a logic voltage to each output line is selected, and means for discharging said output lines when not selected by the column decoder to prevent unwanted buildup of voltage thereon, said means for discharging including a first transistor having source-drain path connected between each output line and reference potential and having a gate connected to a complement of said clock voltage means through the source-drain path of a second transistor which has its gate connected to the column decoder output.

2. A device according to claim 1 wherein said memory cells are of the one-transistor type having field effect transistors.

3. A device according to claim 1 wherein said output lines of the column decoder are connected to select circuits for column output conductors.

4. A device according to claim 3 wherein said column output conductors include a plurality of lines on each side of sense amplifiers in the center of each column.

5. An electronic device comprising: an array of elements; means for accessing the array by a first address along with a second address applied to decoding means, output lines from the decoding means being coupled to selector means for the array, clock voltage means for applying a logic voltage to each output line if selected, and means for discharging said output lines when not selected by the decoder means to prevent unwanted buildup of voltage thereon, said means for discharging including a first control device having a current path connected between each output line and reference potential and having a controlling electrode connected to a complement of said clock voltage means through the current path of a second control device which has its controlling electrode connected to the output of the decoding means.

6. A device according to claim 5 wherein said device is a semiconductor memory, and said array of elements is an array of memory cells.

7. A device according to claim 6 wherein said memory cells are of the one-transistor MOS type.

8. A device according to claim 7 wherein the cells are in rows and columns and the first address is a row address and the second address is a column address.

9. A device according to claim 8 wherein said means for discharging is connected to output lines for the column address outputs of the decoder.

* * * * *